US009769561B1

(12) United States Patent
Clark

(10) Patent No.: US 9,769,561 B1
(45) Date of Patent: Sep. 19, 2017

(54) ROTATING SPEAKER ARRAY

(71) Applicant: Murray R. Clark, North Little Rock, AR (US)

(72) Inventor: Murray R. Clark, North Little Rock, AR (US)

( * ) Notice: Subject to any disclaimer, the term of this patent is extended or adjusted under 35 U.S.C. 154(b) by 0 days.

(21) Appl. No.: 15/255,342

(22) Filed: Sep. 2, 2016

(51) Int. Cl.

| | |
|---|---|
| ***H03G 3/00*** | (2006.01) |
| ***H04R 1/30*** | (2006.01) |
| ***H04R 3/14*** | (2006.01) |
| ***G10H 1/047*** | (2006.01) |
| *G10H 1/045* | (2006.01) |
| *G10H 1/043* | (2006.01) |

(52) U.S. Cl.
CPC ............... *H04R 1/30* (2013.01); *G10H 1/047* (2013.01); *H04R 3/14* (2013.01); *G10H 1/043* (2013.01); *G10H 1/045* (2013.01); *H04R 2201/028* (2013.01)

(58) Field of Classification Search
CPC . H04R 1/34; H04R 1/345; H04R 1/30; H04R 3/14; H04R 1/025; G10H 1/047; G10H 1/043; G10H 1/045
USPC ....................................... 381/98–99, 160, 62
See application file for complete search history.

(56) References Cited

U.S. PATENT DOCUMENTS 647,147 A 4/1900 Myers
2,114,680 A 4/1938 Goldsmith
2,489,653 A 11/1949 Leslie
2,869,667 A 1/1959 Leslie
3,095,467 A 6/1963 Schwartz et al.
3,157,247 A 11/1964 Ishimura
3,288,908 A 11/1966 Markowitz
3,483,945 A 12/1969 Michael
3,520,559 A 7/1970 Ross
3,624,266 A 11/1971 Sharp
3,695,385 A 10/1972 Sharp
3,842,204 A 10/1974 Leslie
3,876,834 A * 4/1975 Suzuki .................. G10H 1/047 381/62
3,888,333 A 6/1975 Yamaguchi
3,961,684 A 6/1976 Michael et al.
4,017,685 A 4/1977 Leslie
4,035,582 A 7/1977 Okamoto
6,873,708 B1 3/2005 Levy
8,498,433 B1 * 7/2013 Lund ..................... H04R 1/028 181/143

(Continued)

OTHER PUBLICATIONS

Henricksen; Unearthing the Mysteries of the Leslie Cabinet; Community Light & Sound; first published in Recording Engineer/Producer magazine, Apr. 1981; www.theatreorgans.com/hammond/faq/mystery/mystery.html; pp. 1-14.

*Primary Examiner* — Disler Paul
(74) *Attorney, Agent, or Firm* — Luedeka Neely Group PC

(57) ABSTRACT

A speaker system includes one or more rotating speakers (or speakers with rotating reflectors) that are synchronized in absolute angular position to another rotating speaker or synchronized to audio effects to generated by a signal processing system driving a stationary or rotary speaker. Knowledge of absolute angular position in a multi-rotor speaker array or signal processing system allows for control of rotary position to accomplish acoustic effects otherwise not possible, such as matched-velocity profiles with differential phase control and motion profiles that are not based on simple rotation.

25 Claims, 15 Drawing Sheets

(56) References Cited

U.S. PATENT DOCUMENTS

| | | | | |
|---|---|---|---|---|
| 2005/0135639 | A1 | 6/2005 | Levy | |
| 2009/0185708 | A1 | 7/2009 | Brunsting | |
| 2009/0202099 | A1* | 8/2009 | Hsu | H04S 7/00 381/387 |
| 2013/0163787 | A1* | 6/2013 | Moon | H03F 3/187 381/120 |
| 2014/0254811 | A1* | 9/2014 | Takeda | H04S 7/303 381/58 |
| 2015/0053497 | A1* | 2/2015 | Horiuchi | H04N 5/642 181/199 |
| 2015/0071451 | A1* | 3/2015 | Moon | H04R 3/04 381/62 |
| 2015/0086035 | A1* | 3/2015 | Shin | H04R 1/02 381/86 |

* cited by examiner

ROTATING SPEAKER ARRAY

FIELD

This invention relates to the field of audio effects. More particularly, this invention relates to a speaker system comprising two or more rotating reflectors that are synchronized in absolute angular position.

BACKGROUND

Arguably, the most well-known rotating speaker system in the audio effects field is referred to as the "Leslie" speaker, named after its inventor, Donald Leslie. One version of the Leslie speaker has two rotating horns, one in front of a stationary high-frequency speaker and one in front of a stationary low-frequency speaker, all in a single cabinet. The rotation of the horns produces a tremolo effect (amplitude modulation) and a variation in pitch due to the Doppler effect (frequency modulation). As stated in Leslie's U.S. Pat. No. 2,489,653, "it is not necessary that the horns from the high and low frequency speakers rotate in synchronism; in fact, best results are frequently obtained by rotating the speakers at different speeds and in opposite directions." Leslie's patent does not disclose synchronizing the absolute angular positions of the two horns as they rotate.

There have been many variations of the Leslie speaker concept over the years, each creating a variation of the tremolo effect. However, none have achieved the acoustic effects that are possible only through control of the absolute angular positions of two or more rotating speakers (or rotating horns or baffles) in a multi-rotor speaker array.

What is needed, therefore, is a multi-rotor speaker array in which the absolute angular position of one rotating speaker in relation to the absolute angular position of another rotating speaker is known and controlled.

SUMMARY

The above and other needs are met by a speaker system consisting of one or more rotating speakers, or one or more speakers with one or more rotating reflectors, that are synchronized in absolute angular position to another rotating speaker or synchronized to audio effects generated by a signal processing system.

Knowledge of absolute angular position in a multi-rotor speaker array or signal processing system allows for control of rotary position to accomplish acoustic effects otherwise not possible, such as matched-velocity profiles with differential phase control and motion profiles that are not based on simple rotation.

In various embodiments described herein, the possible motion profiles of the rotary tremulants are limited only by the acceleration capability of the motion control system. Examples of novel motion profiles that may produce interesting acoustic effects include the following:

- Scanning with unequal peak velocities. One rotary reflector is scanned back and forth through a fixed angular range at a fixed repetition rate. Another rotary reflector is scanned through a larger angular range with the same repetition rate as the other reflector, and with a peak velocity that is higher than that of the other reflector, with a fixed or variable phase delay.
- Rotation with variable speed. Two rotary reflectors are rotated at a low angular velocity through an angular range that includes the listener, and are then rotated through the remainder of the range at a higher angular velocity. The rotational positions of the two reflectors are separated by a fixed or variable phase delay. (See FIG. 3.)
- Envelope detector, additive or subtractive.—Each rotary reflector is rotated at a fixed or variable rate, with angular velocity modulated by the addition or subtraction of the output from an envelope detector that is underdamped. The natural frequency and amplitude of modulation is within the acceleration capability of the motion control system, with a fixed or variable phase delay. This creates a vibrato effect upon the attack of a note.
- Synchronization with electronic amplitude and or frequency modulation.—Each rotary reflector is rotated at a fixed or variable rate while electronic amplitude and or frequency modulation is applied in a manner that is phase locked to the angular position of the rotors. This enhances the amplitude and frequency modulation that occurs due to the rotation of the tremulants. (See FIG. 15.)

Many configurations of two or more rotating speakers (or speakers with rotating reflectors) with control of absolute angular position are possible. Although five preferred embodiments are discussed herein, these embodiments are exemplary only. One skilled in the art will appreciate that many other embodiments that fall within the scope of the claims may be realized.

One preferred embodiment of an audio effects apparatus described herein includes first and second rotatable sound directing devices. The first rotatable sound directing device directs acoustical sound waves along a first sound directional axis, and the second rotatable sound directing device directs acoustical sound waves along a second sound directional axis. First and second rotary devices are coupled to the first and second rotatable sound directing devices, respectively. The first rotary device continuously rotates the first sound directional axis of the first rotatable sound directing device about a first rotational axis in response to a first rotational drive signal. The second rotary device continuously rotates the second sound directional axis of the second rotatable sound directing device about a second rotational axis in response to a second rotational drive signal. A first encoding device generates a first rotational position signal that is indicative of a rotational position of the first rotary device, and a second encoding device generates a second rotational position signal that is indicative of a rotational position of the second rotary device. The apparatus includes a motion control signal processing device that receives the first and second rotational position signals and generates one or both of the first and second rotational drive signals based on the first and second rotational position signals.

In some embodiments, the first rotatable sound directing device or the second rotatable sound directing device or both comprise an audio speaker or an audio reflector or a combination of an audio speaker and an audio reflector.

In some embodiments, the first and second rotary devices comprise an electric motor or an electric motor assembly that includes an encoder and bearing.

In some embodiments, the first rotational axis is parallel with the second rotational axis, and in some embodiments, the first rotational axis is collinear with the second rotational axis.

In some embodiments, the audio effects apparatus includes one or more audio power electronics circuits for amplifying an audio input signal from an audio input signal source and providing an amplified audio input signal to the first and second rotatable sound directing devices.

In some embodiments, the motion control signal processing device generates the first rotational drive signal to cause the first rotary device to continuously rotate the first sound directional axis of the first rotatable sound directing device about the first rotational axis at a first angular rate through a first portion of each full rotation and at a second angular rate through a second portion of each full rotation. In these embodiments, the motion control signal processing device generates the second rotational drive signal to cause the second rotary device to rotate the second sound directional axis of the second rotatable sound directing device about the second rotational axis at the first angular rate through a first portion of each full rotation and at the second angular rate through a second portion of each full rotation. Each full rotation of the second sound directional axis is delayed by a predetermined delay time with respect to each full rotation of the first sound directional axis.

In some embodiments, the first and second sound directional axes scan at the first angular rate across a listener location within the first portion of the full rotation of the first and second sound directional axes. The first angular rate is less than the second angular rate, so that the first and second sound directional axes scan across the listener location more slowly than they rotate through the second portion of the full rotation.

In some embodiments, the audio effects apparatus includes a crossover network for filtering the amplified audio input signal into a low-frequency range audio signal and a high-frequency range audio signal. The low-frequency range audio signal may be provided to the first rotatable sound directing device and the high-frequency range audio signal may be provided to the second rotatable sound directing device.

In some embodiments, the motion control signal processing device generates the first rotational drive signal to cause the first rotary device to continuously rotate the first sound directional axis of the first rotatable sound directing device through full rotations about the first rotational axis at a first angular rate. In these embodiments, the motion control signal processing device generates the second rotational drive signal to cause the second rotary device to rotate the second sound directional axis of the second rotatable sound directing device through full rotations about the second rotational axis at a second angular rate.

In some embodiments, the first angular rate is less than or greater than the second angular rate, and a ratio of the first angular rate to the second angular rate is an integer value or is a ratio of two integers differing by one, so that the first and second sound directional axes periodically align in only one angular direction during rotation.

In some embodiments, the first angular rate is less than or greater than the second angular rate, and a ratio of the first angular rate to the second angular rate is other than a non-integer value or is other than a ratio of two integers differing by one, so that the first and second sound directional axes periodically align in multiple angular directions during rotation, and the multiple angular directions are separated by a constant angular value.

Another preferred embodiment of an audio effects apparatus described herein includes a rotatable sound directing device and a fixed sound directing device. The rotatable sound directing device is operable to direct acoustical sound waves along a rotatable sound directional axis, and the fixed sound directing device is operable to direct acoustical sound waves along a fixed sound directional axis. A rotary device is operable to continuously rotate the rotatable sound directional axis about a rotational axis in response to a rotational drive signal. An encoding device generates a rotational position signal that is indicative of a rotational position of the rotary device. The audio effects apparatus includes a motion control and audio signal processing device that receives the rotational position signal and the audio input signal, and generates the rotational drive signal based at least in part on the rotational position signal. The motion control and audio signal processing device also separates an audio input signal into a first audio signal and a second audio signal, and modulates the second audio signal based at least in part on the rotational position signal, thereby generating a modulated audio signal. A first audio power electronics circuit amplifies the first audio signal and provides the amplified first audio signal to the rotatable sound directing device. A second audio power electronics circuit amplifies the modulated audio signal and provides the amplified modulated audio signal to the fixed sound directing device.

In some embodiments, the motion control and audio signal processing device modulates the amplitude and frequency of the second audio signal based at least in part on the rotational position signal.

In some embodiments, the motion control and audio signal processing device modulates the frequency of the second audio signal between a maximum offset frequency and a minimum offset frequency based on a sine wave that completes one cycle per revolution of the rotary device. The motion control and audio signal processing device modulates the amplitude of the second audio signal based on a rectified sine wave having peaks aligned with the minimum and maximum offset frequencies of the second audio signal.

In some embodiments, the motion control and audio signal processing device modulates the frequency of the second audio signal using a digital midrange boost filter having a variable center frequency that varies based on the sine wave that completes one cycle per revolution of the rotary device.

Another preferred embodiment of an audio effects apparatus described herein includes four rotatable sound directing devices that are operable to direct acoustical sound waves along four sound directional axes. Four rotary devices are provided, each coupled to a corresponding one of the rotatable sound directing devices. Each rotary device continuously rotates the sound directional axis of the rotatable sound directing device to which it is coupled about a rotational axis in response to a rotational drive signal. Four encoding devices generate rotational position signals that are indicative of rotational positions of the four rotary devices. The apparatus includes a first housing that encloses two of the rotatable sound directing devices and their corresponding rotary devices and encoding devices. The apparatus includes a second housing that encloses the other two rotatable sound directing devices and their corresponding rotary devices and encoding devices. A motion control signal processing device receives the four rotational position signals and generates the four rotational drive signals based thereon.

In some embodiments, the audio effects apparatus includes one or more audio power electronics circuits that amplify an audio input signal from an audio input signal source and provide the amplified audio signal to the four sound directing devices.

In some embodiments, the audio effects apparatus includes first and second crossover networks. The first crossover network filters the amplified audio signal into a first low-frequency range audio signal and a first high-frequency range audio signal. The first low-frequency range audio signal is provided to a first one of the rotatable sound directing devices and the first high-frequency range audio signal is provided to a second one of the rotatable sound directing devices. The second crossover network filters the amplified audio signal into a second low-frequency range audio signal and a second high-frequency range audio signal. The second low-frequency range audio signal is provided to a third one of the rotatable sound directing devices and the second high-frequency range audio signal is provided to a fourth one of the rotatable sound directing devices.

In some embodiments, each of the rotatable sound directing devices comprises an audio speaker or an audio reflector or a combination of an audio speaker and an audio reflector Another preferred embodiment of an audio effects apparatus includes a rotatable sound directing device and a rotary device coupled to the rotatable sound directing device. The rotatable sound directing device is operable to direct acoustical sound waves along a rotatable sound directional axis, and the rotary device is operable to continuously rotate the rotatable sound directional axis of the rotatable sound directing device about a rotational axis in response to a rotational drive signal. An encoding device generates a rotational position signal that is indicative of a rotational position of the rotary device. A motion control and audio signal processing device receives the rotational position signal and an audio input signal, generates the rotational drive signal based on the rotational position signal, and modulates the audio signal based on the rotational position signal, thereby generating a modulated audio signal that is directed to the rotatable sound directing device.

In some embodiments, the motion control and audio signal processing device generates the rotational drive signal to drive the rotary device to move the rotatable sound directing device back and forth in opposite directions during a scan cycle over an angular scan range that includes a listener location.

In some embodiments, the motion control and audio signal processing device modulates the phase of the audio signal based on a repeating wave pattern that completes two wave pattern cycles per scan cycle of the rotary device.

BRIEF DESCRIPTION OF THE DRAWINGS

Other embodiments of the invention will become apparent by reference to the detailed description in conjunction with the figures, wherein elements are not to scale so as to more clearly show the details, wherein like reference numbers indicate like elements throughout the several views, and wherein.

DETAILED DESCRIPTION

As the term is used herein, a "sound directing device" is an audio speaker or driver that generates sound or it is an audio reflector that reflects sound generated by an audio speaker or driver.

As the term is used herein, a "reflector" is any surface that reflects sound generated by a speaker or driver or other audio sound generating device. A reflector may be flat, curved, parabolic, horn shaped, or any other shape.

As the terms are used herein, a "speaker" or "driver" are audio sound generating devices that receive an electrical audio signal and generate an acoustical audio signal.

As the term is used herein, an "encoder" or "encoding device" is an electro-mechanical or electro-optical or electro-magnetic device that converts the angular rotational position of a motor shaft or other rotating structure into an analog or digital signal that may be used as an input to a motion control system.

As the term is used herein, a "sound directional axis" of a reflector or speaker is the general direction of travel of acoustical sound waves generated by the speaker or reflected from the reflector.

First Embodiment—Dual Rotor and Full Frequency Range Drivers

Figure 1:
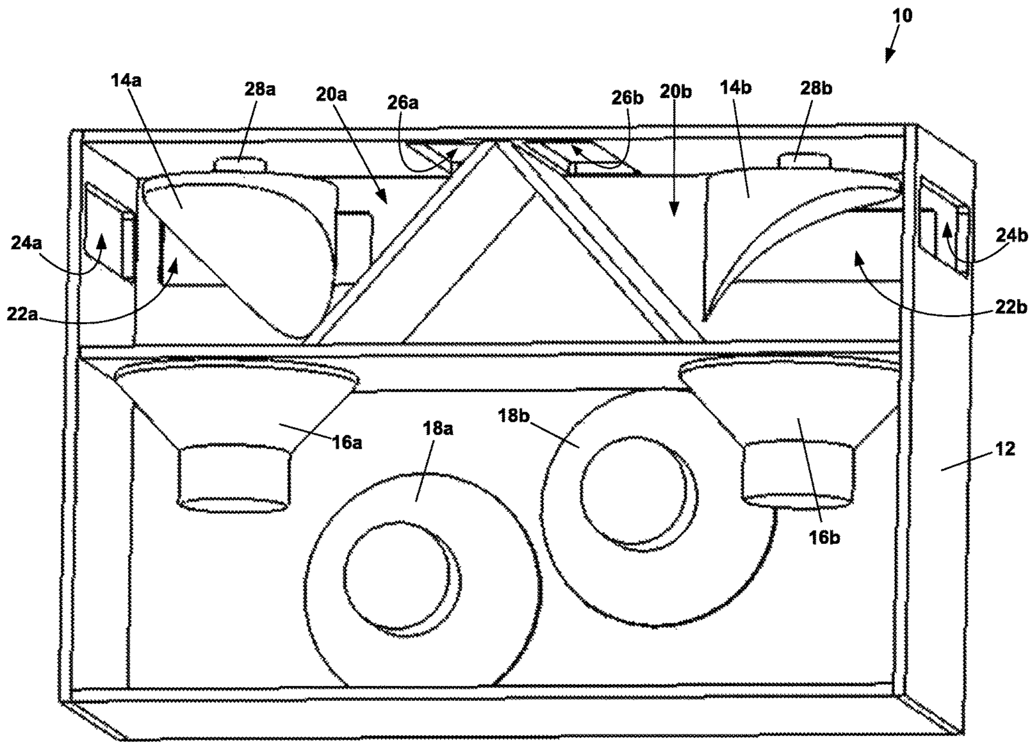
FIG. 1 depicts a speaker system having two full-range speakers and two rotary reflectors according to a first embodiment.

FIG. 1 depicts a speaker assembly 10 according to a first embodiment. The speaker assembly 10 of FIG. 1 includes a single housing 12 (shown with its rear panel removed) that encloses two synchronized rotary reflectors **14*a*-14*b*. The reflectors 14*a*-14*b* reflect sound generated by upward-facing full-range speakers 16*a*-16*b* disposed below the reflectors 14*a*-14*b*. The sound directional axes of the reflectors 14*a*-14*b* are generally perpendicular to the sound directional axes of the speakers 16*a*-16*b*. The housing 12 also encloses two forward-facing speakers 18*a*-18*b* that are not equipped with reflectors. The reflectors 14*a*-14*b* are disposed within upper chambers 20*a*-20*b* that have front sound ports 22*a*-22*b*, side sound ports 24*a*-24*b*, and top sound ports 26*a*-26*b*. In the preferred embodiment, the rear panel (not shown) also has a rear sound port for each rotary reflector 14*a*-14*b*. The rotary reflectors 14*a*-14*b* are rotated by electric motor/encoder/bearing assemblies 28*a*-28*b* mounted to the housing 10**.

Figure 2:
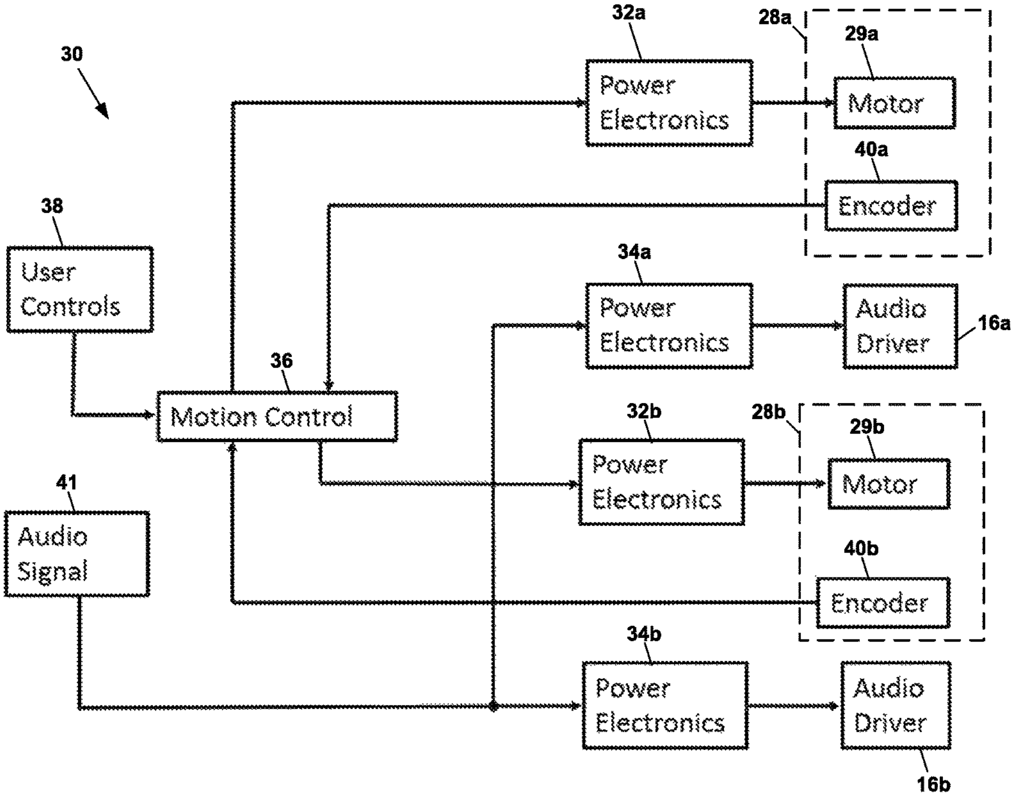
FIG. 2 depicts an embodiment of a drive system for the speaker system depicted in FIG. 1.

FIG. 2 depicts a drive system 30 for driving and controlling the speaker assembly 10 depicted in FIG. 1. A preferred embodiment of the system 30 includes two control loops for synchronizing the two rotary reflectors **14*a*-14*b*, each control loop including a motor drive power electronics circuit 32*a*-32*b* for driving an electric motor 29*a*-29*b* and an encoder 40a-40b for generating position signals based on rotational positions of the rotary reflectors 14a-14b. In the preferred embodiment, the motors 29a-29b and encoders 40a-40b are components of the motor/encoder/bearing assemblies 28a-28b. A motion control computer processor 36 generates motion control signals based on the encoder signals and based on user control signals generated by one or more user input devices 38. Examples of user input devices 38 include foot pedals with continuously variable output and/or foot switches. Audio power electronics circuits 34a-34b receive an audio input signal from an audio device 41, such as an electronic organ, an electric guitar or a microphone, and generate amplified audio signals for driving the speakers 16a-16**b.

Figure 3:
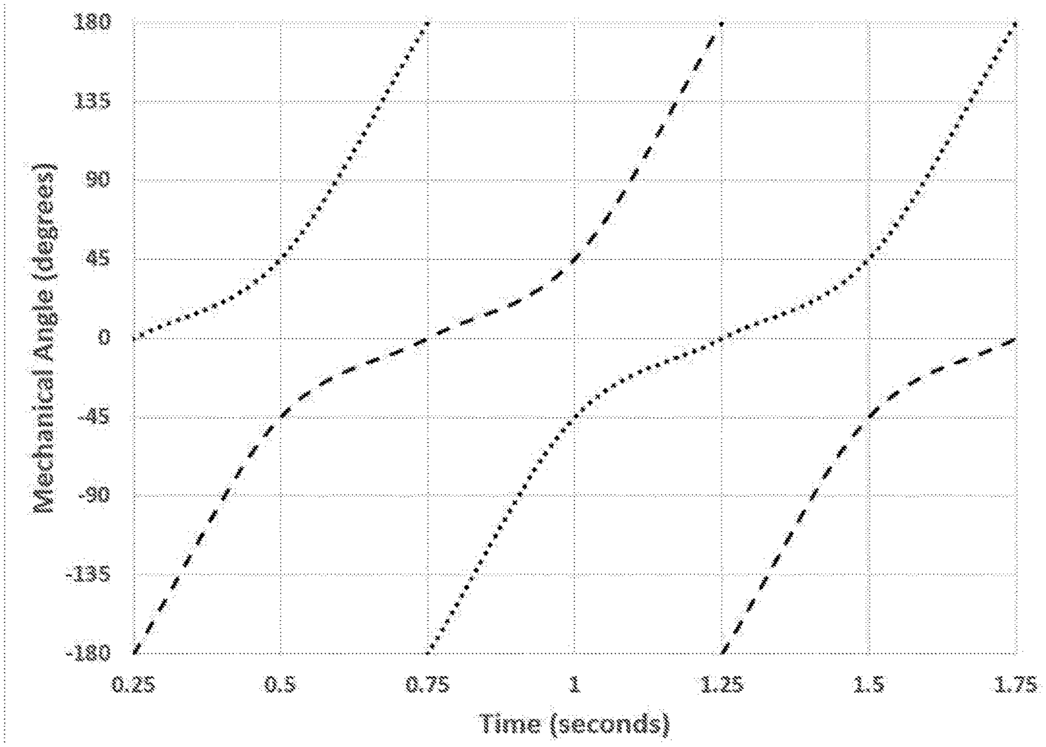
FIG. 3 depicts exemplary motion trajectories for the speaker system depicted in FIG. 1.
Figure 11:
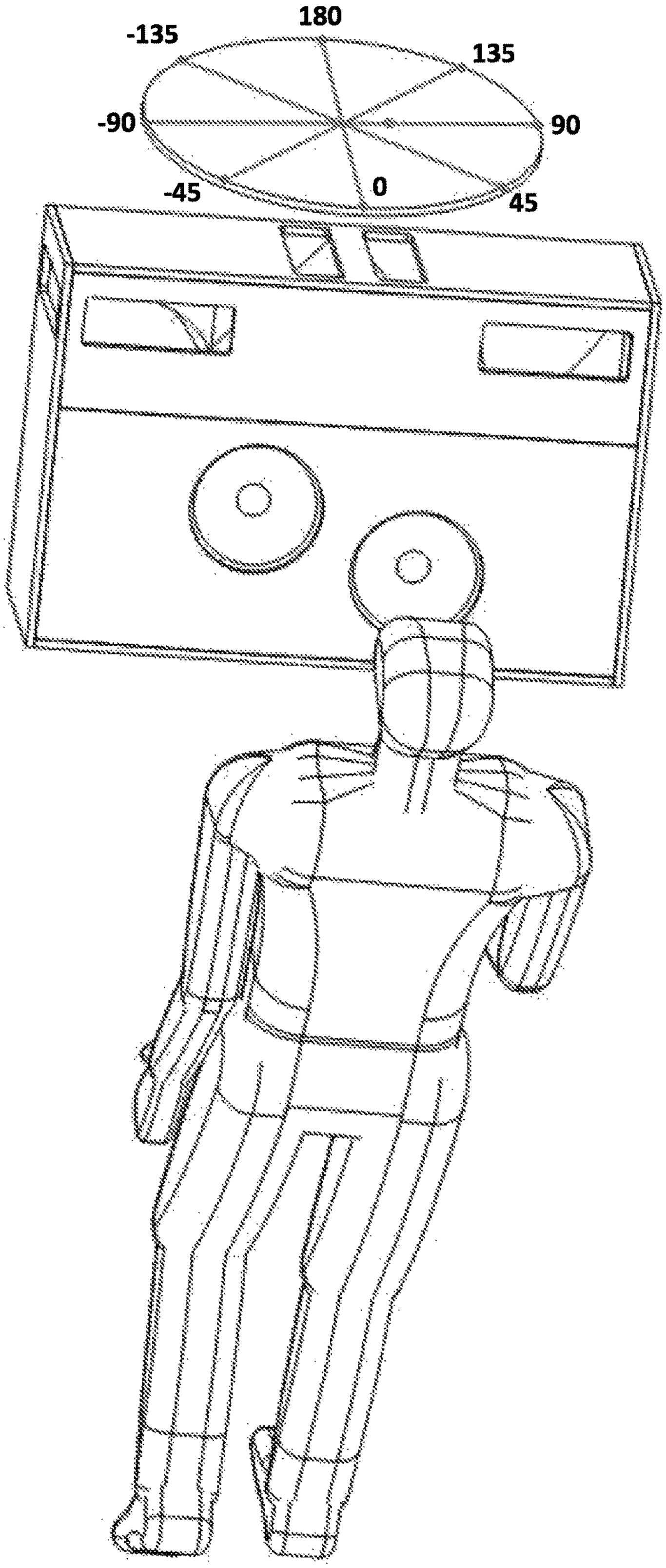
FIG. 11 depicts an exemplary orientation of a rotary speaker system with respect to a listener.

FIG. 3 depicts an example of a variable-speed motion trajectory that may be attained using the embodiment of FIGS. 1 and 2. In this example, the "mechanical angle" of FIG. 3 refers to the angular orientation of the reflectors' sound directional axes with respect to the position of a listener. This angular orientation is depicted in FIG. 11 for an exemplary listening situation. As depicted in FIG. 3, the sound directional axis of each reflector 14a-14b is rotated at a relatively low angular velocity (such as 180 degrees/second) through an angular range that includes the listener. The reflectors 14a-14b traverse the remainder of their revolutions at a higher angular velocity (such as 540 degrees/second). In this example, the sound directional axis of the left hand reflector (dashed line) traverses a 90 degree range that includes the listener in about 0.5 seconds. The remainder of the revolution is accomplished in about 0.75 seconds for a total rotation period of about 1.25 seconds. The right hand reflector (dotted line) has the same motion profile but is delayed by 0.5 seconds with respect to the motion profile of the left hand reflector. Thus, the sound directional axis of one reflector or the other is always within 45 degrees of the listener's position. In this example, the user input devices 38 may be used to control rotational speed and phase differential between the two reflectors 14a-14b.

Figure 4:
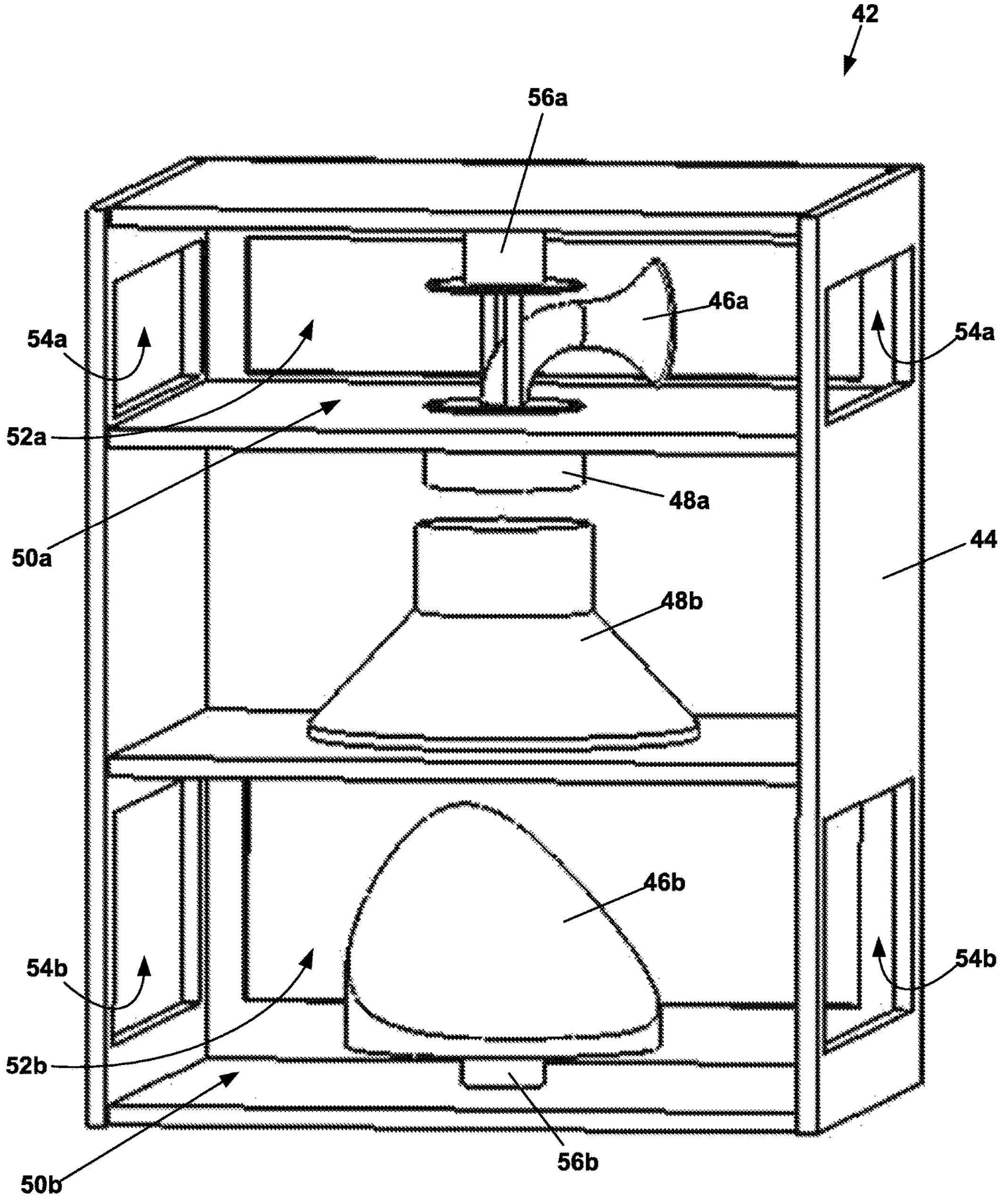
FIG. 4 depicts a speaker system having a high-range speaker and a low-range speaker, each having a rotary reflector according to a second embodiment.

Second Embodiment—Dual Rotor and Low/High Range Drivers with Crossover Network FIG. 4 depicts a speaker assembly 42 according to a second embodiment. The speaker assembly 42 of FIG. 4 includes a single housing 44 (shown with its rear panel removed) that encloses two rotary reflectors 46a-46b. The reflector 46a reflects sound generated by an upward-facing high-range speaker 48a disposed below the reflector 46a. The reflector 46b reflects sound generated by an downward-facing low-range speaker 48b disposed above the reflector 46b. The sound directional axes of the reflectors 46a-46b are generally perpendicular to the sound directional axes of the speakers 48a-48b. The reflector 46a is disposed within an upper chamber 50a that has a front sound port 52a and side sound ports 54a. The reflector 46b is disposed within a lower chamber 50b that has a front sound port 52b and side sound ports 54b. In the preferred embodiment, the rear panel (not shown) also has a rear sound port for each rotary reflector 46a-46b. The rotary reflectors 46a-46b are rotated by electric motor/encoder/bearing assemblies 56a-56b mounted to the housing 44.

Figure 5:
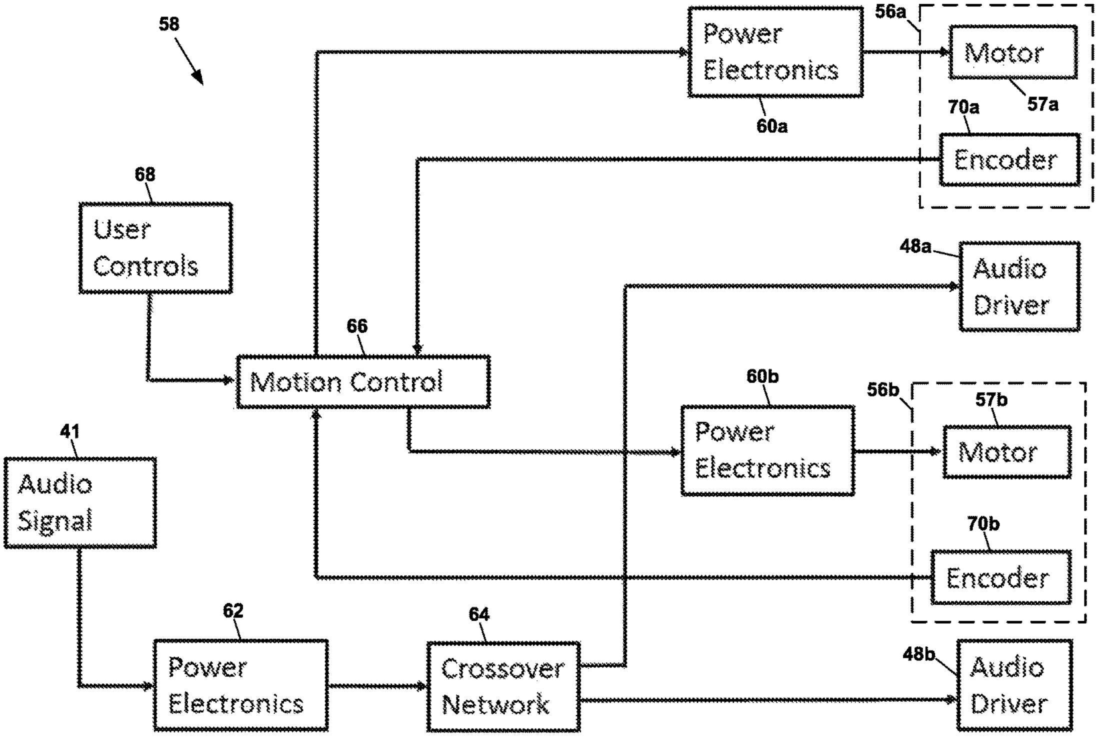
FIG. 5 depicts an embodiment of a drive system for the speaker system depicted in FIG. 4.

FIG. 5 depicts a drive system 58 for driving and controlling the speaker assembly 42 depicted in FIG. 4. A preferred embodiment of the system 58 includes two control loops for controlling the two rotary reflectors 46a-46b, each control loop including a motor drive power electronics circuit 60a-60b for driving an electric motor 57a-57b and an encoder 70a-70b for generating position signals based on rotational positions of the rotary reflectors 46a-46b. In the preferred embodiment, the motors 57a-57b and encoders 70a-70b are components of the motor/encoder/bearing assemblies 56a-56b. A motion control computer processor 66 generates motion control signals based on the encoder signals and based on user control signals generated by one or more user input devices 68. Examples of user input devices 68 include foot pedals with continuously variable output and/or foot switches. An audio power electronics circuit 62 receives an audio input signal from an audio device 41, such as an electronic organ, an electric guitar or a microphone, and generates amplified audio signals. The amplified audio signals, which are filtered into low-frequency and high-frequency ranges by a crossover network 64, drive the speakers 48a-48b.

Figure 6:
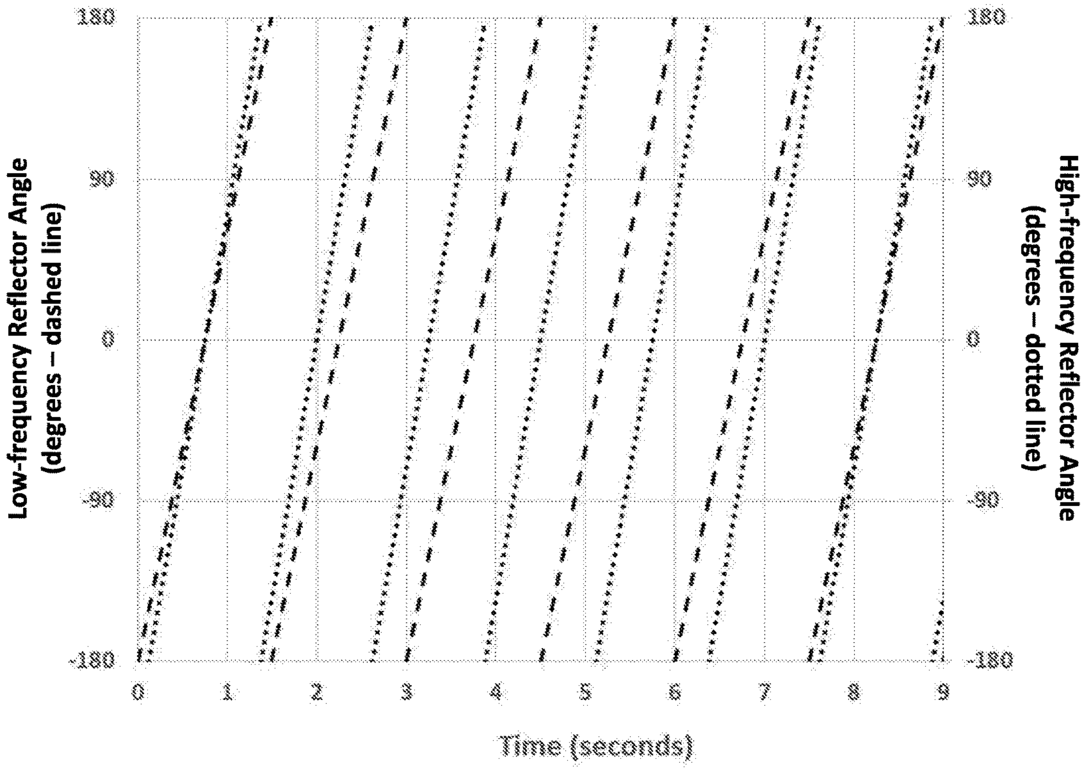
FIGS. 6 and 7 depict exemplary motion trajectories for the speaker system depicted in FIG. 4.

FIG. 6 depicts an example of a constant-speed motion trajectory that may be attained using the embodiment of FIGS. 4 and 5. In this example, the low-frequency reflector 46b (dashed line) is controlled to maintain a constant velocity of 240 degrees per second, while the high-frequency reflector 46a (dotted line) is driven at 288 degrees per second (a ratio of 6 to 5). This results in an instantaneous alignment of the sound directional axes of the reflectors at zero degrees once every 7.5 seconds.

Figure 7:
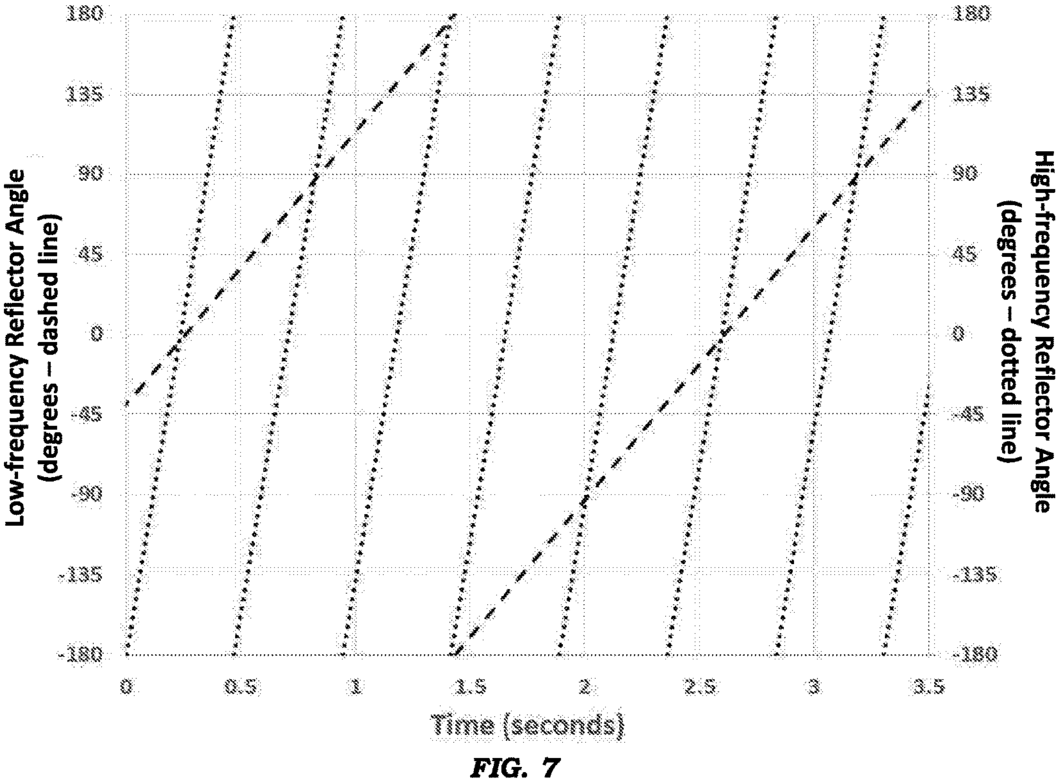

Alternatively, the two reflectors 46a-46b could be controlled to maintain rotational velocities that do not have an integer ratio relationship, or to maintain rotational velocities that are not related by a ratio of two integers differing by one. This results in instantaneous angular alignments of the sound directional axes of the reflectors that rotate over time, as depicted in FIG. 7. In this example, the low-frequency reflector 46b (dashed line) is controlled to maintain a constant velocity of 155 degrees per second, while the high-frequency reflector 46a (dotted line) is driven at 760 degrees per second. This results in an instantaneous alignment of the sound directional axes of the reflectors once every 0.6 seconds, separated by 90 degrees in rotation. With appropriate motion programming, the instantaneous angular alignments of the sound directional axes could be made to "scan" back and forth across an angular range that includes the listener. Motion profiles that are not pure rotation are also possible.

In these examples, the user input devices 68 could be used to control various parameters, including the rotation rate and velocity difference between the reflectors, or to control the locations of instantaneous alignment of the sound directional axes of the reflectors.

Third Embodiment—Single Mechanical Reflector and Virtual Second Reflector

Figure 8:
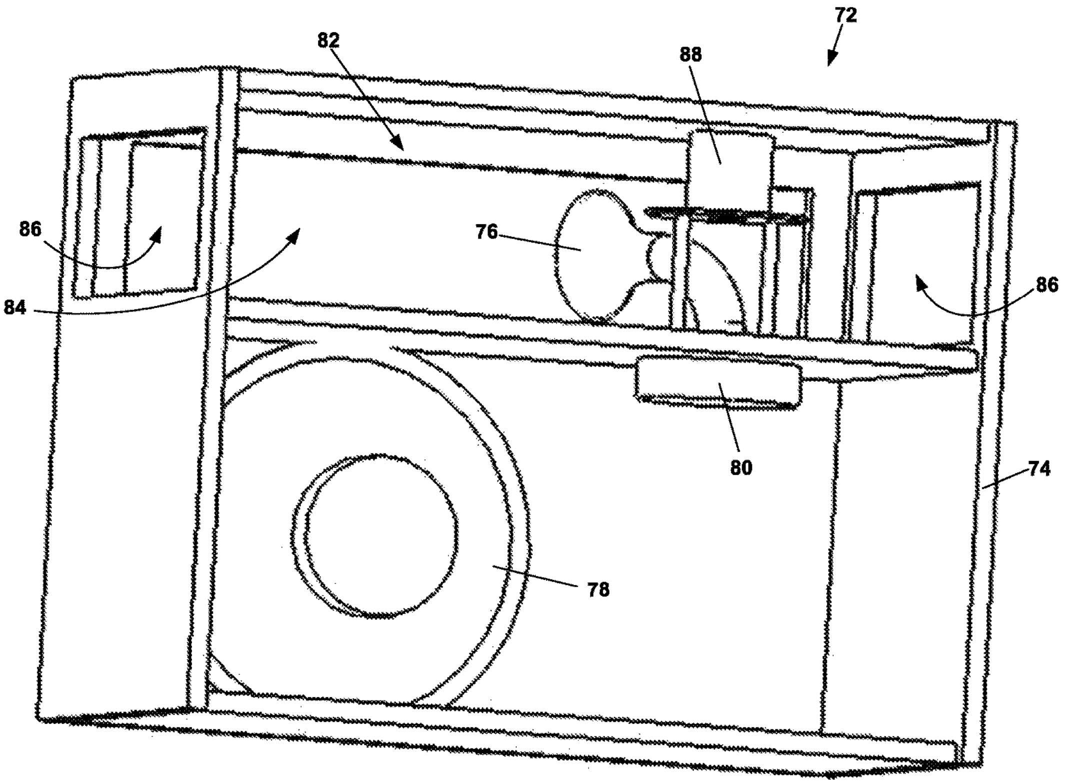
FIG. 8 depicts a speaker system having a high-range speaker with a rotary reflector and a low-range speaker with no reflector according to a third embodiment.

FIG. 8 depicts a speaker assembly 72 according to a third embodiment. The speaker assembly 72 of FIG. 8 includes a single housing 74 (shown with its rear panel removed) that encloses one rotary reflector 76 and a low-frequency speaker 78 without a reflector. The reflector 76 reflects sound generated by an upward-facing high-range speaker 80 disposed below the reflector 76. The sound directional axis of the reflector 76 is generally perpendicular to the sound directional axis of the speaker 80. The reflector 76 is disposed within an upper chamber 82 that has a front sound port 84 and side sound ports 86. In the preferred embodiment, the rear panel (not shown) also has a rear sound port for the reflector 76. The reflector 76 is rotated by an electric motor/encoder/bearing assembly 88 mounted to the housing 74. As described in more detail below, a signal processor generates control signals to control the angular position of the reflector 76 and the virtual angular position of a virtual reflector. Synchronization of the rotary reflector 76 with the virtual reflector allows for implementation of acoustic effects that are not possible without synchronization.

Figure 9:
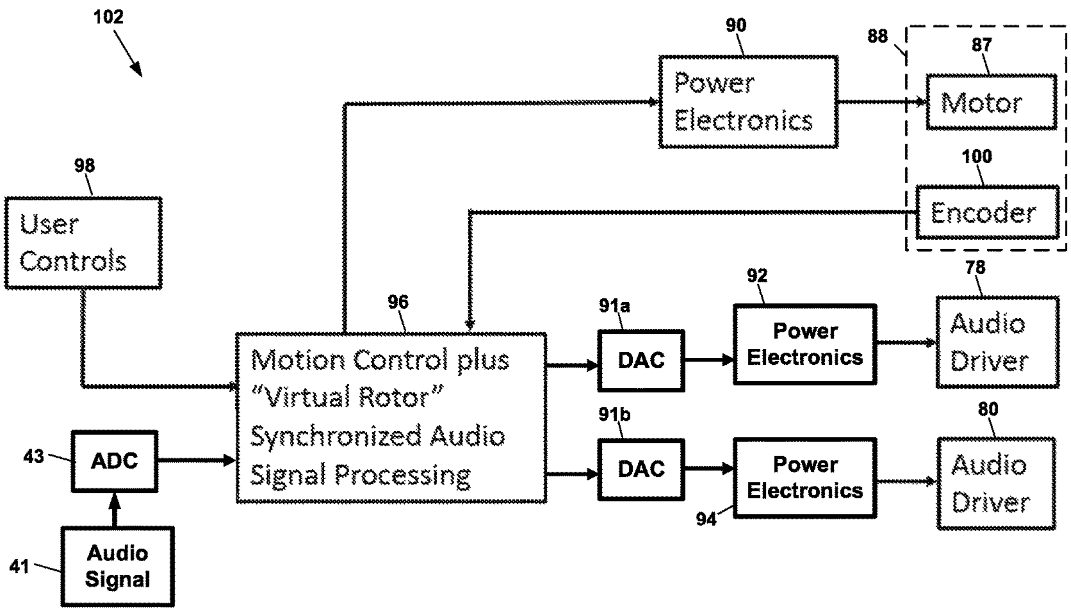
FIG. 9 depicts an embodiment of a drive system for the speaker system depicted in FIG. 8.

FIG. 9 depicts a drive system 102 for driving and controlling the speaker assembly 72 depicted in FIG. 8. A preferred embodiment of the system 102 includes a single control loop for synchronizing the rotary reflector 76 with processed audio signals that embody the virtual reflector. The control loop includes a motor drive power electronics circuit 90 for driving an electric motor 87 and an encoder 100 for generating position signals based on rotational positions of the rotary reflector 76. In the preferred embodiment, the motor 87 and encoder 100 are components of the motor/encoder/bearing assembly 88. A motion control computer processor 96 generates motion control signals based on the encoder signals and based on user control signals generated by one or more user input devices 98. Examples of user input devices 98 include foot pedals with continuously variable output and/or foot switches.

The computer processor 96 also processes an audio input signal from an audio device 41, such as an electronic organ, an electric guitar or a microphone, and generates two processed audio signal channels. The audio input signal is converted to a digital signal by an analog-to-digital converter (ADC) 43 for processing by the processor 96. The two processed audio channels, which are synchronized with the angular position of the rotary reflector 76, are converted by DACs 91*a*-91*b* to analog signals and are amplified by the two corresponding audio power electronics circuits 92 and 94 to drive the low-frequency speaker 78 and high-frequency speaker 80.

Figure 10:
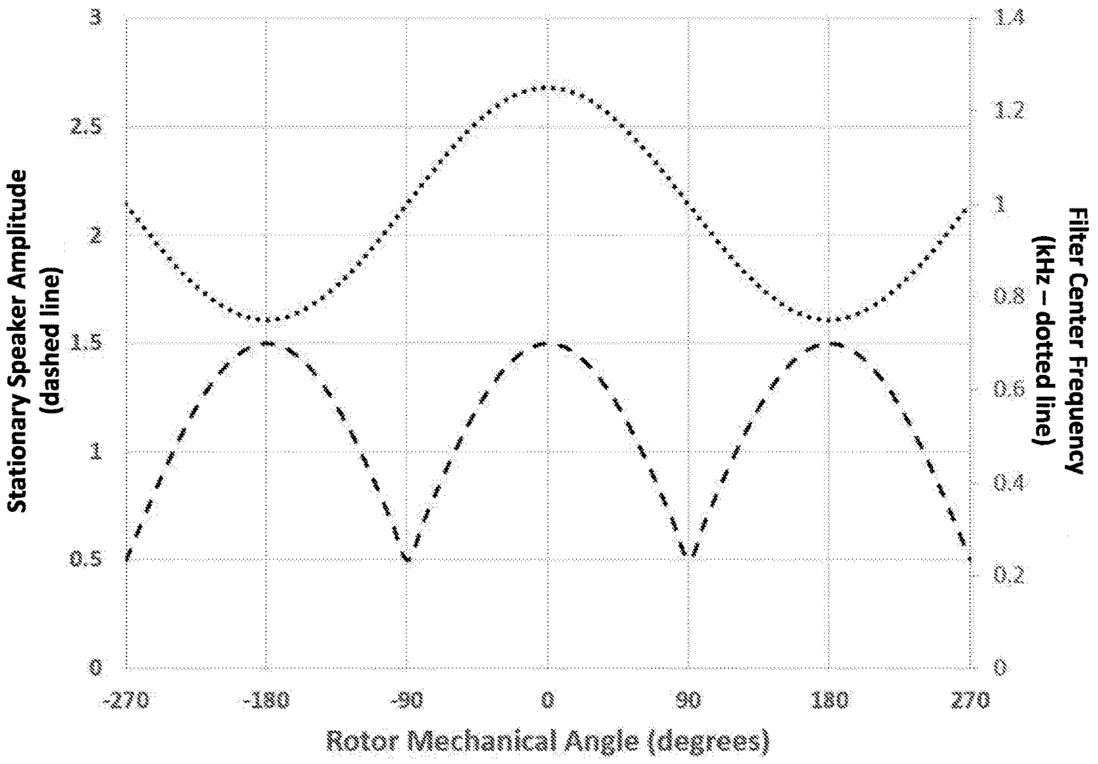
FIG. 10 depicts exemplary motion trajectories for the speaker system depicted in FIG. 8.

FIG. 10 depicts exemplary motion trajectories that may be attained for a single mechanical rotary reflector and a virtual rotary reflector using the embodiment of FIGS. 8 and 9. In this embodiment, the fixed speaker 78 is driven by an amplitude modulated signal, which is preferably a rectified sine wave (dashed line) that has two peaks per each revolution of the rotary reflector 76. Meanwhile, the speaker 80 is driven by a signal that is processed with a midrange boost filter having a variable center frequency that is sine wave modulated (dotted line) at one cycle per revolution of the reflector 76. In a preferred embodiment, the user input devices 98 are used to control rotation rate and depth of amplitude modulation. The "Virtual Rotor" synchronization of physical motion to signal processing can be implemented with any of the embodiments discussed herein.

The synchronization of audio signal processing to the motion control of a rotating tremulant enables acoustic effects that are not possible without synchronization. Examples include angular position-based filters and modulators. The bandwidth of an electronic audio signal processing system is much larger than that of a practical motion control system (e.g. 20000 Hz vs 20 Hz). Thus, signal processing algorithms that require larger bandwidths can be achieved in the electronic domain, with synchronization to the lower-bandwidth motion control.

Fourth Embodiment—Four Rotary Reflectors with Low/High Range Drivers with Crossover Network A fourth embodiment comprises four synchronized rotary reflectors associated with four speakers that form a pair of crossover-networked two-way speakers, in one or two enclosures. A two-enclosure configuration could be realized by duplication of the dual-reflector, crossover network configuration of FIG. 4, with a four axis motion controller.

Figure 12:
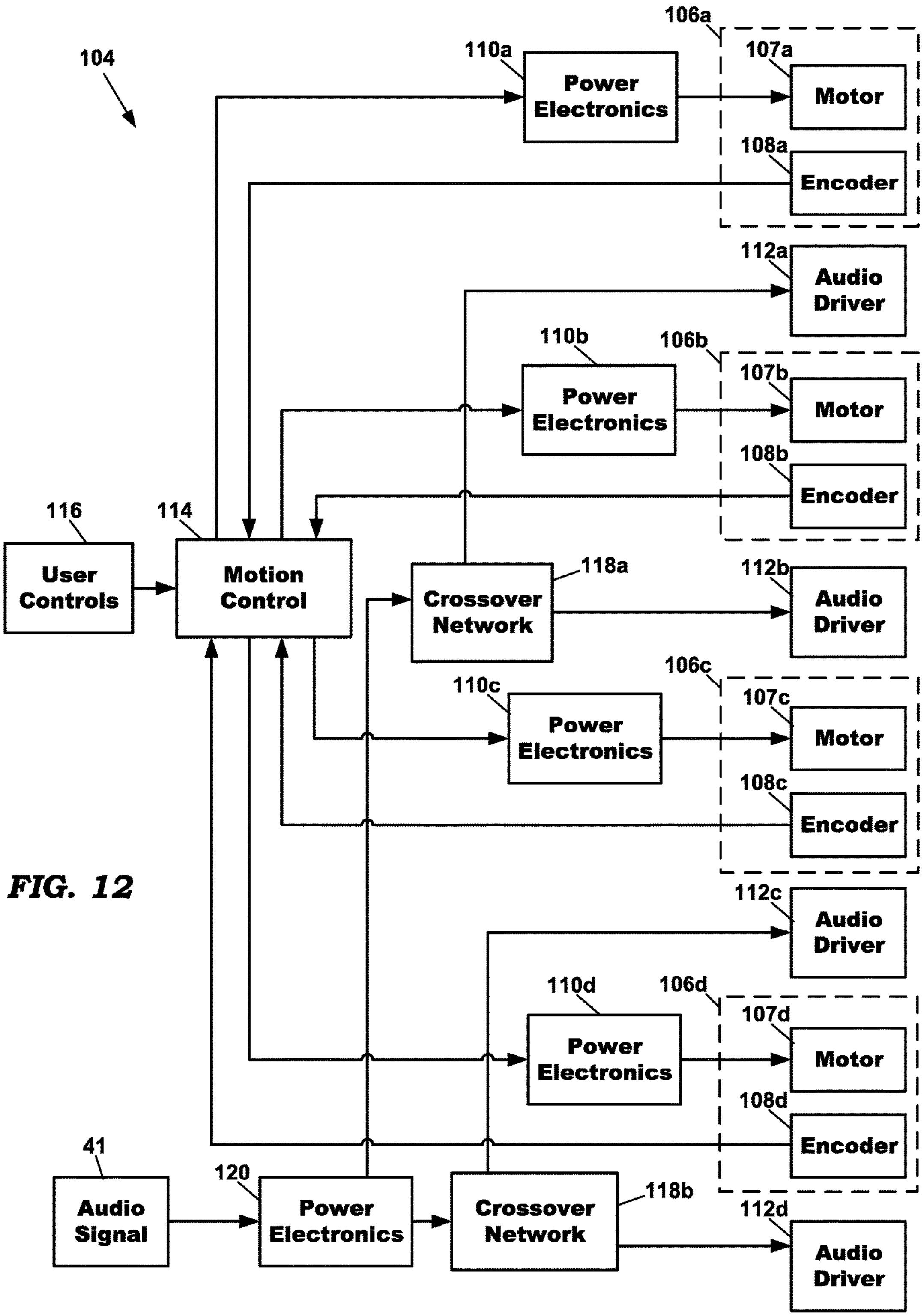
FIG. 12 depicts a drive system having two high-range speakers and two low-range speakers, each having a rotary reflector according to a fourth embodiment.

An exemplary block diagram of a drive system 104 of the fourth embodiment is depicted in FIG. 12. The system 104 preferably includes four control loops for synchronizing four motor/encoder/bearing assemblies 106*a*-106*d* driving four rotary reflectors. Each control loop includes a motor drive power electronics circuit 110*a*-110*d* for driving an electric motor 107*a*-107*d* and an encoder 108*a*-108*d* for generating position signals based on rotational positions of the rotary reflectors. In the preferred embodiment, the motors 107*a*-107*d* and encoders 108*a*-108*d* are components of the motor/encoder/bearing assemblies 106*a*-106*d*. A motion control computer processor 114 generates motion control signals based on the encoder signals and based on user control signals generated by one or more user input devices 116. An audio power electronics circuit 120 receives an audio input signal from an audio device 41, such as an electronic organ, an electric guitar or a microphone, and generates amplified audio signals. The amplified audio signal, which is filtered into low-frequency and high-frequency ranges by two crossover networks 118*a*-118*b*, drives the speakers 112*a*-112*d*.

All of the power electronics, motor/encoder/bearing assemblies, speakers, and crossover networks of the fourth embodiment could all be enclosed in one housing. Alternatively, a first pair of the reflectors and their associated power electronics 110*a*-110*b*, motor/encoder/bearing assemblies 106*a*-106*b*, speakers 112*a*-112*b*, and crossover network 118*a* could be enclosed in a first housing, and a second pair of the reflectors and their associated their power electronics 110*c*-110*d*, motor/encoder/bearing assemblies 106*c*-106*d*, speakers 112*c*-112*d*, and crossover network 118*b* could be enclosed in a second housing.

Fifth Embodiment—Single Mechanical Reflector

Figure 13:
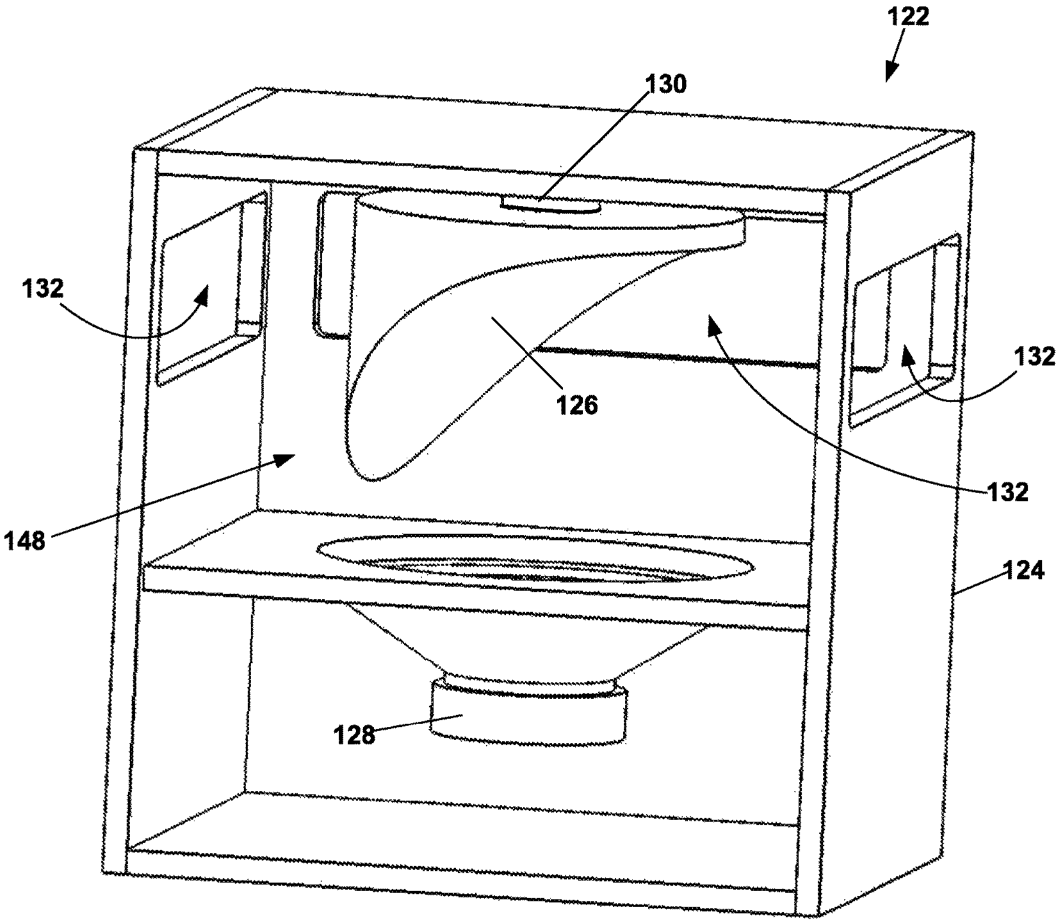
FIG. 13 depicts a speaker system having a speaker with a rotary reflector according to a fifth embodiment.

FIG. 13 depicts a speaker assembly 122 according to a fifth embodiment. The speaker assembly 122 of FIG. 13 includes a single housing 124 (shown with its rear panel removed) that encloses one rotary reflector 126 that reflects sound generated by an upward-facing speaker 128 disposed below the reflector 126. The sound directional axis of the reflector 126 is generally perpendicular to the sound directional axis of the speaker 128. The reflector 126 is disposed within an upper chamber 148 that has front and side sound ports 132. In the preferred embodiment, the rear panel (not shown) also has a rear sound port for the reflector 126. The reflector 126 is rotated by an electric motor/encoder/bearing assembly 130 mounted to the housing 124. As described in more detail below, a signal processor generates control signals to control the angular position of the reflector 126 and modulation of the audio signal. Synchronization of the rotary reflector 126 with the modulation of the audio signal allows for implementation of acoustic effects that are not possible without synchronization.

Figure 14:
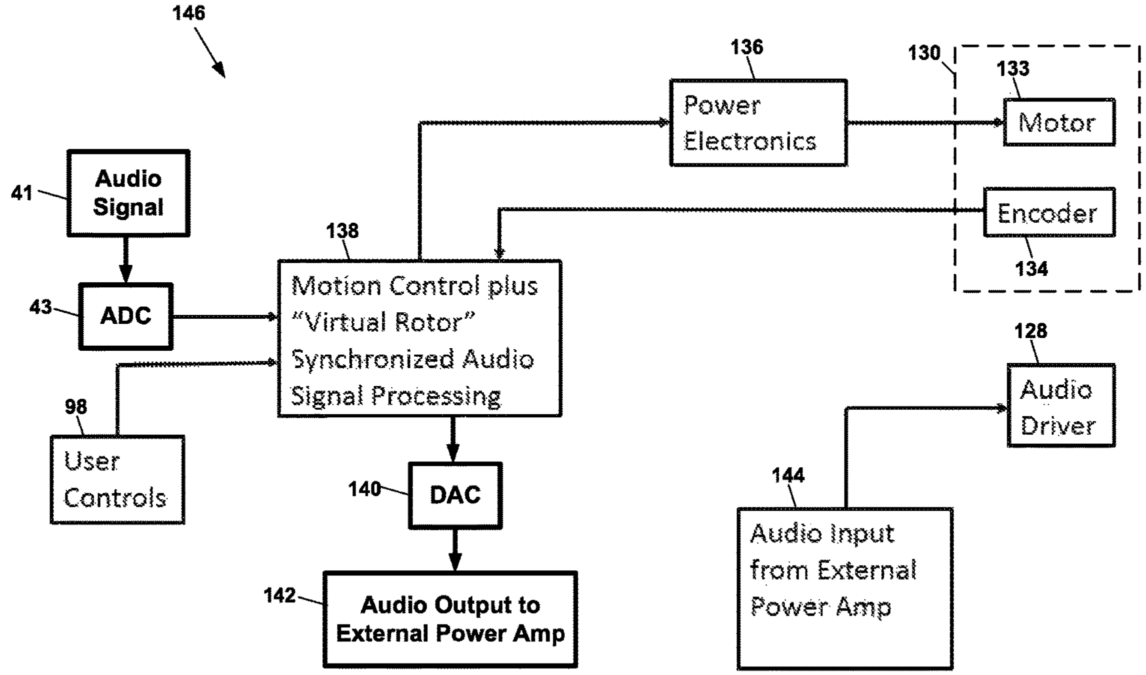
FIG. 14 depicts an embodiment of a drive system for the speaker system depicted in FIG. 13.

FIG. 14 depicts a drive system 146 for driving and controlling the speaker assembly 122 depicted in FIG. 13. A preferred embodiment of the system 146 includes a single control loop for synchronizing the rotary reflector 126 with processed audio signals. The control loop includes a motor drive power electronics circuit 136 for driving an electric motor 133 and an encoder 134 for generating position signals based on rotational positions of the rotary reflector 126. In the preferred embodiment, the motor 133 and encoder 134 are components of the motor/encoder/bearing assembly 130. A motion control computer processor 138 generates motion control signals based on the encoder signals and based on user control signals generated by one or more user input devices 98. Examples of user input devices 98 include foot pedals with continuously variable output and/or foot switches.

The computer processor 138 also processes an audio input signal from an audio device 41, such as an electronic organ, an electric guitar or a microphone, and generates a processed audio signal channel. The audio input signal is converted to a digital signal by an ADC 43 for processing by the processor 138. In an alternative embodiment, the processor 138 is an analog processing unit, such that conversion to the digital domain is not necessary. In one preferred embodiment, the processed audio channel, which is synchronized with the angular position of the rotary reflector 126, is converted to an analog signal by a digital-to-analog converter (DAC) 140 and is provided to an output 142 to an external audio power amplifier. An amplified audio signal from the external amplifier is provided to an input 144 to drive the speaker 128. In an alternative embodiment, the analog signal from the DAC 140 is amplified by an audio power amplifier that is housed within the enclosure 124. Those skilled in the art will appreciate that the ADC 43 and DAC 140 depicted in FIG. 14 are not needed in an all-analog processing embodiment of the drive system 146.

Figure 15:
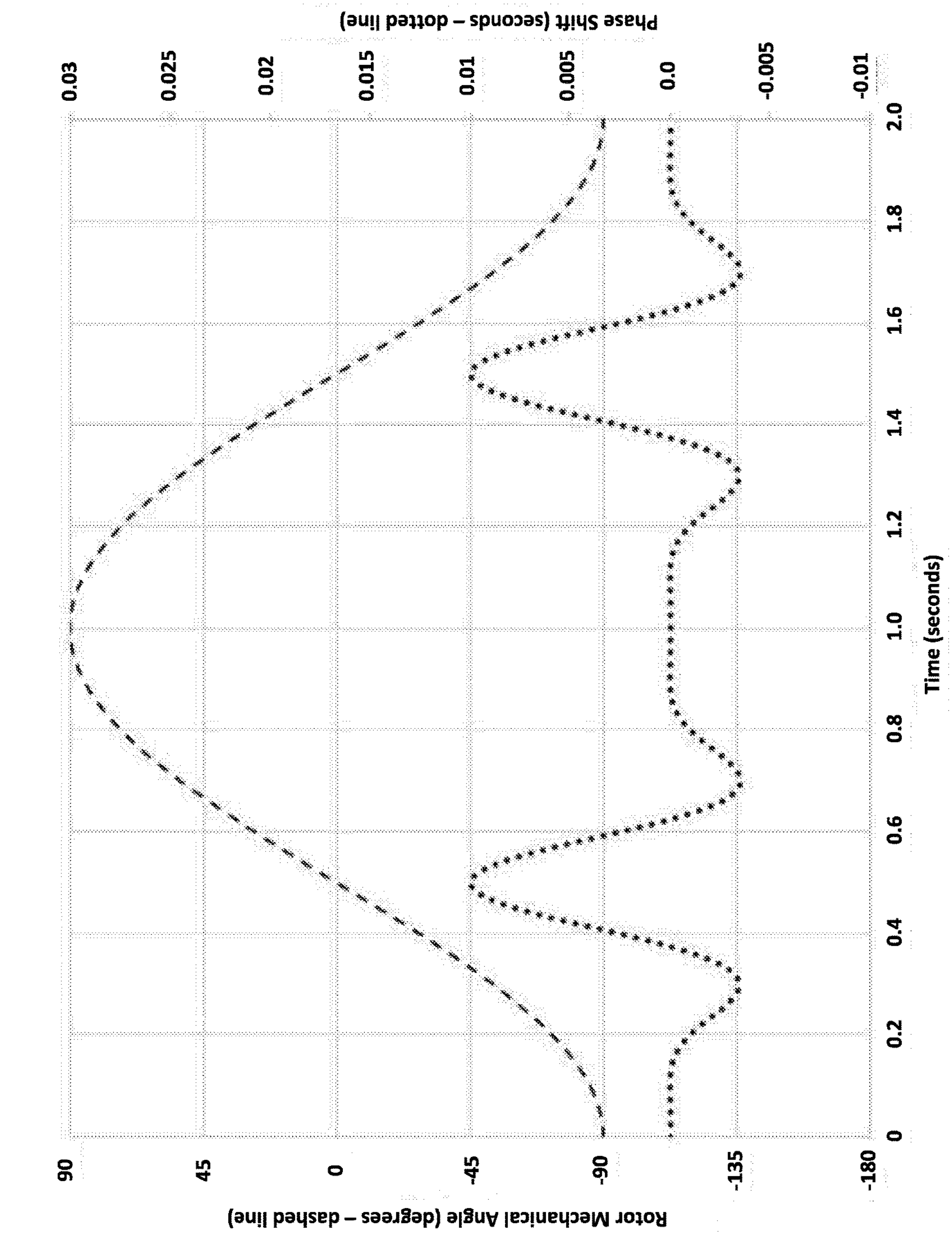
FIG. 15 depicts an exemplary motion trajectory for the speaker system depicted in FIG. 13.

FIG. 15 depicts an exemplary motion trajectory that may be attained for a single mechanical rotary reflector and single speaker using the embodiment of FIGS. 13 and 14. In this trajectory, the speaker 128 is driven by an audio signal that comprises an unmodulated signal combined with a signal that has its phase modulated by a sine wave having peaks of +10 and −5 milliseconds (dotted line). Meanwhile, the motor/encoder/bearing assembly 130 is controlled to scan the reflector 126 back and forth every two seconds through a 180-degree range that includes the listener (dashed line). In a preferred embodiment, the user input devices 98 are used to control the scan rate and the phase modulation. The addition of the synchronized phase shift accentuates the Doppler effect due to the motion of the reflector 126, and its effect is most pronounced while the reflector is aimed at the listener.

The foregoing description of preferred embodiments have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An audio effects apparatus comprising:

a first rotatable sound directing device that is operable to direct acoustical sound waves along a first sound directional axis;

a first rotary device coupled to the first rotatable sound directing device, the first rotary device operable to continuously rotate the first sound directional axis of the first rotatable sound directing device about a first rotational axis in response to a first rotational drive signal;

a first encoding device for generating a first rotational position signal that is indicative of a rotational position of the first rotary device;

a second rotatable sound directing device that is operable to direct acoustical sound waves along a second sound directional axis;

a second rotary device coupled to the second rotatable sound directing device, the second rotary device operable to continuously rotate the second sound directional axis of the second rotatable sound directing device about a second rotational axis in response to a second rotational drive signal;

a second encoding device for generating a second rotational position signal that is indicative of a rotational position of the second rotary device; and a motion control signal processing device for receiving the first and second rotational position signals and generating one or both of the first and second rotational drive signals based on the first and second rotational position signals.

2. The audio effects apparatus of claim 1 wherein one or both of the first and second rotatable sound directing devices comprise an audio speaker or an audio reflector or a combination of an audio speaker and an audio reflector.

3. The audio effects apparatus of claim 1 wherein one or both of the first and second rotary devices comprise an electric motor.

4. The audio effects apparatus of claim 1 wherein one or both of the first and second encoding devices comprise an electro-mechanical encoder or an electro-optical encoder or an electro-magnetic encoder.

5. The audio effects apparatus of claim 1 wherein the first rotational axis is parallel with the second rotational axis.

6. The audio effects apparatus of claim 1 wherein the first rotational axis is collinear with the second rotational axis.

7. The audio effects apparatus of claim 1 further comprising one or more audio power electronics circuits for amplifying an audio input signal from an audio input signal source and providing an amplified audio input signal to the first and second rotatable sound directing devices.

8. The audio effects apparatus of claim 1 wherein the motion control signal processing device generates the first rotational drive signal to cause the first rotary device to continuously rotate the first sound directional axis of the first rotatable sound directing device through full rotations about the first rotational axis, wherein the first rotational drive signal causes the first rotary device to rotate the first sound directional axis at a first angular rate through a first portion of each full rotation and at a second angular rate through a second portion of each full rotation, and the motion control signal processing device generates the second rotational drive signal to cause the second rotary device to rotate the second sound directional axis of the second rotatable sound directing device through full rotations about the second rotational axis, wherein the second rotational drive signal causes the second rotary device to rotate the second sound directional axis at the first angular rate through a first portion of each full rotation and at the second angular rate through a second portion of each full rotation, wherein each full rotation of the second sound directional axis is delayed by a predetermined delay time with respect to each full rotation of the first sound directional axis.

9. The audio effects apparatus of claim 1 wherein, within the first portion of the full rotation of the first and second sound directional axes, the first and second sound directional axes scan across a listener location, and the first angular rate is less than the second angular rate, so that the first and second sound directional axes scan across the listener location more slowly than they rotate through the second portion of the full rotation.

10. The audio effects apparatus of claim 7 further comprising a crossover network for filtering the amplified audio input signal into a low-frequency range audio signal and a high-frequency range audio signal, and wherein the low-frequency range audio signal is provided to the first rotatable sound directing device and the high-frequency range audio signal is provided to the second rotatable sound directing device.

11. The audio effects apparatus of claim 10 wherein the motion control signal processing device generates the first rotational drive signal to cause the first rotary device to continuously rotate the first sound directional axis of the first rotatable sound directing device through full rotations about the first rotational axis at a first angular rate, and the motion control signal processing device generates the second rotational drive signal to cause the second rotary device to rotate the second sound directional axis of the second rotatable sound directing device through full rotations about the second rotational axis at a second angular rate.

12. The audio effects apparatus of claim 11 wherein the first angular rate is less than or greater than the second angular rate, wherein a ratio of the first angular rate to the second angular rate is an integer value or is a ratio of two integers differing by one, and wherein the first and second sound directional axes periodically align in only one angular direction during rotation.

13. The audio effects apparatus of claim 11 wherein the first angular rate is less than or greater than the second angular rate, wherein a ratio of the first angular rate to the second angular rate is other than a non-integer value or is other than a ratio of two integers differing by one, and wherein the first and second sound directional axes periodically align in multiple angular directions during rotation, wherein the multiple angular directions are separated by a constant angular value.

14. An audio effects apparatus comprising:

a rotatable sound directing device that is operable to direct acoustical sound waves along a rotatable sound directional axis;

a rotary device coupled to the rotatable sound directing device, the rotary device operable to continuously rotate the rotatable sound directional axis of the rotatable sound directing device about a rotational axis in response to a rotational drive signal;

an encoding device for generating a rotational position signal that is indicative of a rotational position of the rotary device;

an audio input for receiving an audio input signal; and a motion control and audio signal processing device for receiving the rotational position signal and the audio input signal, for generating the rotational drive signal based at least in part on the rotational position signal, and for modulating the audio input signal based at least in part on the rotational position signal, thereby generating a modulated audio signal.

15. The audio effects apparatus of claim 14 wherein the modulated audio signal is directed to the rotatable sound directing device.

16. The audio effects apparatus of claim 14 wherein the motion control and audio signal processing device generates the rotational drive signal to drive the rotary device to move the rotatable sound directing device back and forth in opposite directions during a scan cycle over an angular scan range that includes a listener location.

17. The audio effects apparatus of claim 14 wherein the motion control and audio signal processing device modulates the phase of the audio signal based on a repeating wave pattern that completes two wave pattern cycles per scan cycle of the rotary device.

18. The audio effects apparatus of claim 14 further comprising:

a fixed sound directing device that is operable to direct acoustical sound waves along a fixed sound directional axis; and the motion control and audio signal processing device further for separating the audio input signal into a first audio signal and a second audio signal, and for modulating the second audio signal based at least in part on the rotational position signal, thereby generating the modulated audio signal, wherein the first audio signal is directed to the rotatable sound directing device, and the modulated audio signal is directed to the fixed sound directing device.

19. The audio effects apparatus of claim 18 wherein the motion control and audio signal processing device modulates one or both of the amplitude and frequency of the second audio signal based at least in part on the rotational position signal.

20. The audio effects apparatus of claim 19 wherein the motion control and audio signal processing device modulates the frequency of the second audio signal by varying the center frequency of a filter between a maximum offset frequency and a minimum offset frequency based on a sine wave that completes one cycle per revolution of the rotary device, and modulates the amplitude of the second audio signal based on a rectified sine wave having peaks aligned with the minimum and maximum offset frequencies of the second audio signal.

21. The audio effects apparatus of claim 19 wherein the filter comprises a digital midrange boost filter having a variable center frequency that varies based on the sine wave that completes one cycle per revolution of the rotary device.

22. An audio effects apparatus comprising:

a first rotatable sound directing device that is operable to direct acoustical sound waves along a first sound directional axis;

a first rotary device coupled to the first rotatable sound directing device, the first rotary device operable to continuously rotate the first sound directional axis of the first rotatable sound directing device about a first rotational axis in response to a first rotational drive signal;

a first encoding device for generating a first rotational position signal that is indicative of a rotational position of the first rotary device;

a second rotatable sound directing device that is operable to direct acoustical sound waves along a second sound directional axis;

a second rotary device coupled to the second rotatable sound directing device, the second rotary device operable to continuously rotate the second sound directional axis of the second rotatable sound directing device about a second rotational axis in response to a second rotational drive signal;

a second encoding device for generating a second rotational position signal that is indicative of a rotational position of the second rotary device;

a third rotatable sound directing device that is operable to direct acoustical sound waves along a third sound directional axis;

a third rotary device coupled to the third rotatable sound directing device, the third rotary device operable to continuously rotate the third sound directional axis of the third rotatable sound directing device about a third rotational axis in response to a third rotational drive signal;

a third encoding device for generating a third rotational position signal that is indicative of a rotational position of the third rotary device;

a fourth rotatable sound directing device that is operable to direct acoustical sound waves along a fourth sound directional axis;

a fourth rotary device coupled to the fourth rotatable sound directing device, the fourth rotary device operable to continuously rotate the fourth sound directional axis of the fourth rotatable sound directing device about a fourth rotational axis in response to a fourth rotational drive signal;

a fourth encoding device for generating a fourth rotational position signal that is indicative of a rotational position of the fourth rotary device;

a first housing that encloses at least the first and second rotatable sound directing devices, the first and second rotary devices, and the first and second encoding devices;

a second housing that encloses at least the third and fourth rotatable sound directing devices, the third and fourth rotary devices, and the third and fourth encoding devices; and a motion control signal processing device for receiving the first, second, third and fourth rotational position signals and generating one or all of the first, second, third and fourth rotational drive signals based on one or more of the first, second, third and fourth rotational position signals.

23. The audio effects apparatus of claim 22 further comprising one or more audio power electronics circuits for amplifying an audio input signal from an audio input signal source and providing an amplified audio signal to the first, second, third and fourth rotatable sound directing devices.

24. The audio effects apparatus of claim 23 further comprising:

a first crossover network for filtering the amplified audio signal into a first low-frequency range audio signal and a first high-frequency range audio signal, wherein the first low-frequency range audio signal is provided to the first rotatable sound directing device and the first high-frequency range audio signal is provided to the second rotatable sound directing device; and a second crossover network for filtering the amplified audio signal into a second low-frequency range audio signal and a second high-frequency range audio signal, wherein the second low-frequency range audio signal is provided to the third rotatable sound directing device and the second high-frequency range audio signal is provided to the fourth rotatable sound directing device.

25. The audio effects apparatus of claim 22 wherein one or more of the first, second, third and fourth rotatable sound directing devices comprise an audio speaker or an audio reflector or a combination of an audio speaker and an audio reflector.

* * * * *